United States Patent
Liu et al.

(10) Patent No.: US 8,563,980 B2
(45) Date of Patent: Oct. 22, 2013

(54) ARRAY SUBSTRATE AND MANUFACTURING METHOD

(75) Inventors: Xiang Liu, Beijing (CN); Zhenyu Xie, Beijing (CN); Xu Chen, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/542,140

(22) Filed: Jul. 5, 2012

(65) Prior Publication Data

US 2013/0175552 A1    Jul. 11, 2013

Related U.S. Application Data

(62) Division of application No. 12/888,171, filed on Sep. 22, 2010, now Pat. No. 8,236,628.

(30) Foreign Application Priority Data

Sep. 25, 2009 (CN) .......................... 2009 1 0093197

(51) Int. Cl.
*H01L 29/04* (2006.01)
*H01L 31/036* (2006.01)
*H01L 31/0376* (2006.01)
*H01L 31/20* (2006.01)

(52) U.S. Cl.
USPC .. 257/59; 257/72; 257/E29.117; 257/E29.273

(58) Field of Classification Search
USPC .......... 257/59, 60, 66, 72, E29.117, E29.273
See application file for complete search history.

(56) References Cited

U.S. PATENT DOCUMENTS

| 7,776,662 B2 | 8/2010 | Wang et al. |
| 7,781,774 B2 * | 8/2010 | Cho et al. ................. 257/72 |

FOREIGN PATENT DOCUMENTS

| CN | 1987622 A | 6/2007 |
| CN | 101192614 A | 6/2008 |

OTHER PUBLICATIONS

USPTO RR mailed Feb. 6, 2012 in connection with U.S. Appl. No. 12/888,171.
USPTO NOA mailed Apr. 6, 2012 in connection with U.S. Appl. No. 12/888,171.

* cited by examiner

*Primary Examiner* — Hoai V Pham
(74) *Attorney, Agent, or Firm* — Ladas & Parry LLP

(57) ABSTRACT

Manufacturing an array substrate includes forming data and gate lines which cross and a gate electrode on a substrate. The data line is discontinuously disposed to be separated from the gate line, or the gate line is discontinuously disposed to be separated from the data line. Active and gate insulating layers including bridge and source electrode vias are formed on the substrate. The bridge vias correspond to adjacent discontinuous sections of the data line or the gate line. The source electrode via corresponds to the data line. Pixel, source, and drain electrodes and a bridge line are formed on the substrate. The pixel electrode and the drain electrode are integral. The source electrode is connected to the data line through the source electrode via. The bridge line connects adjacent discontinuous sections of the data line or adjacent discontinuous sections of the gate line through bridge vias.

12 Claims, 8 Drawing Sheets

ARRAY SUBSTRATE AND MANUFACTURING METHOD

CROSS-REFERENCE TO RELATED APPLICATIONS

This application is a division of U.S. application No. 12/888,171, filed Sep. 22, 2010, now U.S. Pat. No. 8,236,628 and is incorporated herein by reference.

BACKGROUND

Embodiments of the present invention relate to an array substrate of a liquid crystal display and a method of manufacturing the same.

Liquid crystal displays (LCD) have the advantages of small weight, small thickness, low radiation and the like. In recent, the liquid crystal display technology is under rapid development; especially, thin film transistor liquid crystal displays (TFT-LCDs) have become the mainstream products in the LCD market, and a method of manufacturing the TFT-LCD has been gradually developed from a seven-mask process at the beginning to a four-mask process that is popular at present.

A liquid crystal panel of a TFT-LCD usually comprises an array substrate and a color filter substrate assembled together with a liquid crystal interposed therebetween. In general, the manufacture of the array substrate can be performed by forming patterns through thin film deposition processes and patterning processes, and a one patterning process fours one layer of pattern. One patterning process is a patterning process performed by using a mask once. One layer of pattern is formed as the following: firstly, depositing one or more thin film layers on a base substrate, and then, coating a photosensitive material layer on a surface of the thin film, and exposing and developing the photosensitive material layer by using a mask to form a desirable photosensitive material layer pattern, and then, performing an etching process by using the photosensitive material pattern formed so as to transfer the photosensitive material pattern to the thin film to form a thin film pattern, and finally, removing the remaining photosensitive material pattern. Each layer of the pattern is precisely stacked above another underlying layer of pattern at a certain precise position. Each layer of the pattern comprises the same material or different materials, and a thickness thereof is generally in a range of between several hundreds nanometers and several micrometers. The four-mask process technology currently used employs a gray-tone mask technology, and through one patterning process of the four-mask process, patterns for an active layer, a source/drain metal electrode can be formed. Generally, there are the less the amount of the mask used, the higher productivity and the lower the manufacturing cost can be obtained during the process for manufacturing the array substrate.

SUMMARY

An embodiment of the present invention provides a method of manufacturing an array substrate, comprising: faulting a data line and a gate line which are crossed with each other and a gate electrode on a base substrate, and the data line is discontinuously disposed so as to be separated from the gate line or the gate line is discontinuously disposed so as to be separated from the data line; forming an active layer and a gate insulating layer including bridge via holes and a source electrode via hole on the base substrate, and the bridge via holes are located at positions respectively corresponding to adjacent discontinuous sections of the data line or adjacent discontinuous sections of the gate line, and the source electrode via hole is located at a position corresponding to the data line; and forming a pixel electrode, a source electrode, a drain electrode and a bridge line on the base substrate, and the pixel electrode and the drain electrode are formed integrally, and the source electrode is connected to the data line through the source electrode via hole, and the bridge line connects the adjacent discontinuous sections of the data line or the adjacent discontinuous sections of the gate line through the bridge via holes.

Another embodiment of the present invention provides an array substrate, comprising: a base substrate, a data line and a gate line crossed with each other on the base substrate so as to define a pixel unit, and a pixel electrode and a thin film transistor (TFT) arranged in the pixel unit, wherein the TFT comprises a gate electrode, an active layer, a source electrode and a drain electrode, the data line and the gate line are formed in the same layer, and the data line is discontinuously disposed so as to be separated from the gate line or the gate line is discontinuously disposed so as to be separated from the data line; bridge via holes and a source electrode via hole are formed in a gate insulating layer covering the data line, the gate line and the gate electrode, and the bridge via holes are located at positions respectively corresponding to adjacent discontinuous sections of the data line or adjacent discontinuous sections of the gate line, and the source electrode via hole corresponds to the data line; and the source electrode, the drain electrode, the pixel electrode and the bridge line are formed in the same layer, and the drain electrode and the pixel electrode are formed integrally, and the source electrode is connected with the data line through the source electrode via hole and the bridge line connects the adjacent discontinuous sections of the data line or the adjacent discontinuous sections of the gate line through the bridge via holes.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

Figure 1:
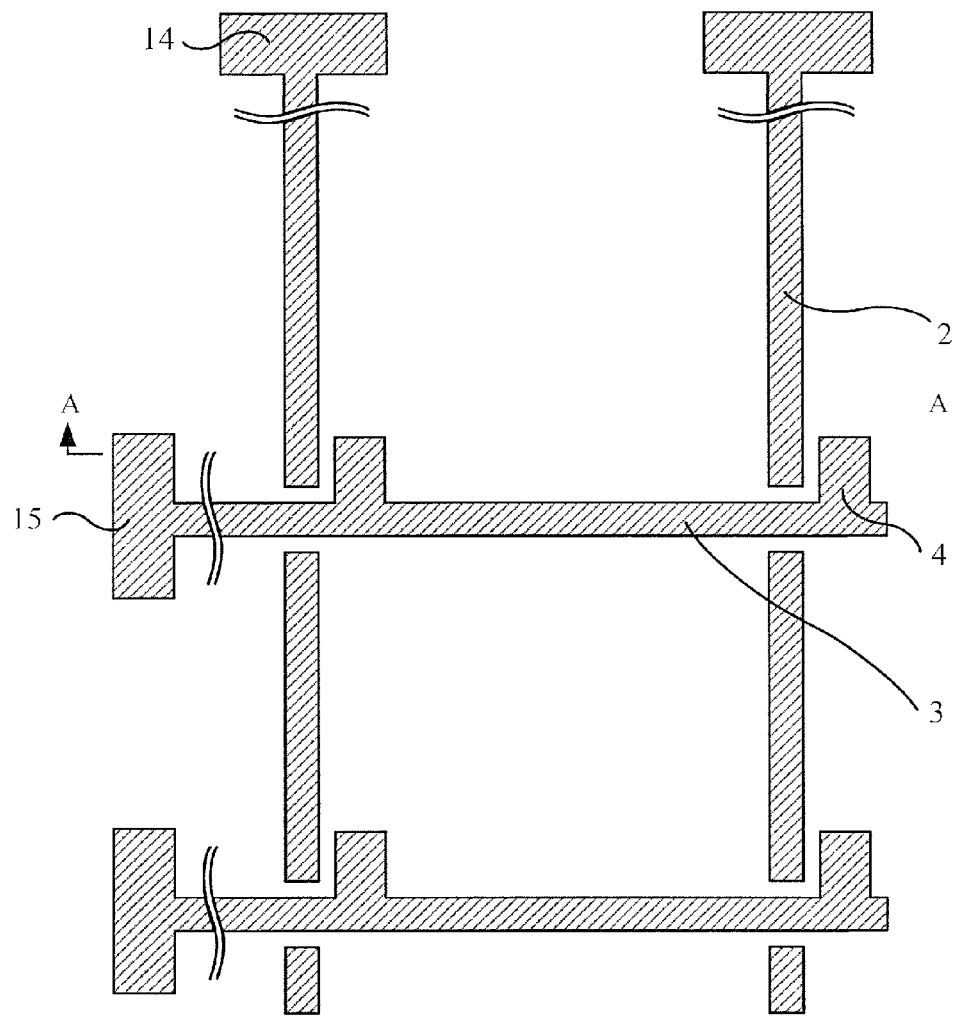
FIG. 1 is a top partial structural schematic view after a first patterning process of the array substrate manufactured in the second embodiment of the present invention.

Hereinafter, embodiments of the invention will be described in detail with the accompanying drawings.

First Embodiment

A method of manufacturing an array substrate according to the first embodiment comprises the following steps.

Step 100, forming a data line and a gate line which are crossed with each other and a gate electrode on a base substrate through a patterning process, and the data line is discontinuously disposed so as to be separated from the gate line, or the gate line is discontinuously disposed so as to be separated from the data line;

Step 200, forming an active layer and a gate insulating layer including bridge via holes and a source electrode via hole on the base substrate after the step 100 through a patterning process, and the bridge via holes are located at positions respectively corresponding to adjacent discontinuous sections of the data line or adjacent discontinuous sections of the gate line, and the source electrode via hole is located at a position corresponding to the data line;

Step 300, forming a pixel electrode, a source electrode, a drain electrode and a bridge line on the base substrate after the step 200 through a patterning process, and the pixel electrode and the drain electrode are formed integrally, and the source electrode is connected to the data line through the source electrode via hole and the bridge line connects the adjacent discontinuous sections of the data line or the adjacent discontinuous sections of the gate line through the bridge via holes.

In another preferable embodiment, in order to protect all pattern structures formed in the array substrate, the following step can be further performed.

Step 400, forming a protection film layer on the base substrate after the step 300.

In addition, because the data line and the gate line need to be connected to a pad region in a peripheral edge region so as to be connected to a driving circuit, a process for forming the pad region may be included in the manufacture of the array substrate, comprising: when forming the data line, the gate line and the gate electrode by the pattering process, the data line pad region and the gate line pad region are further formed in a peripheral edge region of the array substrate; when forming the active layer, the bridge via hole and the source electrode via hole by the patterning process, a first pad region via hole is further formed in the gate insulating layer to exposure the data line pad region and the gate line pad region; and after forming the protection film layer, a second pad region via hole is further formed in the protection film layer by a patterning process to exposure the data line pad region and the gate line pad region.

One patterning process may comprise exposing and developing of photoresist, etching with a photoresist pattern, removing remaining photoresist and the like. In the present embodiment, the circuit patterns on the array substrate can be formed by a three-photolithography (3-mask) process, and as compared with the current four-mask process, the productivity of the array substrate may be significantly improved and the manufacturing cost may be decreased.

As a new method of manufacturing the array substrate, the present embodiment may be embodied in another manner, for example, the patterning process for forming the active layer, the bridge via holes and the source electrode via hole in step 200 may be performed by using the one patterning process or two patterning processes. With one patterning process, a gate insulating layer thin film and an active layer thin film are sequentially deposited, and next, the gate insulating layer thin film and the active layer thin film is exposed and developed by employing a half-tone mask or a gray-tone mask and is etched then. With two patterning processes, the gate insulating layer thin film is firstly deposited and processed by using one patterning process to form the gate insulating layer in which the bridge via holes and the source electrode via hole are formed, and then, the active layer thin film is deposited and processed by using another patterning process to form the active layer.

In operation, a material, a deposition process and a specific shape of patterns formed and the like of each conductive structure may be modified as necessary.

Second Embodiment

A method of manufacturing the array substrate according to the second embodiment is based on the first embodiment and comprises the following steps.

Forming a data line and a gate line which are crossed with each other and a gate electrode on a base substrate through a patterning process in the step 100 may comprise: Step 110, depositing a metal thin film on a base substrate 1. For example, on a transparent glass substrate or a quartz substrate as the base substrate 1, the metal thin film with a thickness of 500~4000 Å is deposited on the base substrate 1 by a magnetron method or a thermal evaporation method, and the metal thin film may be a multilayer metal thin film consisted of any one or more of Cr, W, Ti, Ta, Mo, Al and Cu or any alloy of Cr, W, Ti, Ta, Mo, Al and Cu.

The first patterning process may comprises:

Step 120, coating a photoresist layer on the metal thin film;

Step 130, exposing and developing the photoresist layer by employing a normal mask to form patterns including a completely-retained region and a completely-removed region, wherein photoresist is completely retained in the completely-retained region and photoresist is removed in the completely-removed region;

Step 140, etching the metal thin film, wherein the metal thin film in the completely-removed region is etched away to at least form a data line 2, a gate line 3 and a gate electrode 4 or simultaneously to form a data line pad region 14 and a gate line pad region 15. In the present embodiment, a discontinuous data line 2 and a continuous gate line 3 are formed as an example.

Figure 2:
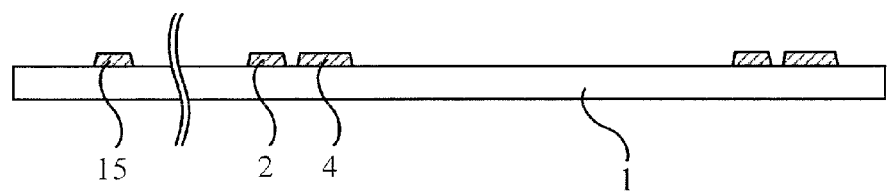
FIG. 2 is a cross-sectional side view taken along line A-A in FIG. 1.

FIG. 1 is a top partial structural schematic view after a first patterning process of the array substrate manufactured in the second embodiment, and FIG. 2 is a cross-sectional side view taken along line A-A in FIG. 1. The region in which a pixel unit is formed is referred to as a pixel region and the periphery of the pixel region is an edge region.

Forming an active layer and a gate insulating layer including bridge via hole and a source electrode via hole on the base substrate after the step 100 through a patterning process in the step 200 may be implemented as following:

Step 210, depositing a gate insulating layer thin film and an active layer thin film on the base substrate 1 after the step 100. For example, the gate insulating layer thin film with a thickness of 1000~4000 Å, a semiconductor layer thin film and a doped semiconductor layer thin film are sequentially deposited on the base substrate 1 after the step 100 by a plasma enhance chemical vapor deposition (PECVD), wherein the semiconductor layer thin film and the doped semiconductor layer thin film are used as an active layer thin film and a total thickness thereof is 1000~4500 Å. The material of the gate insulating layer thin film may be selected from oxide, nitride or oxynitride, and corresponding reaction gas for the gate insulating layer thin film may be a mixture gas of $SiH_4$, $NH_3$ and $N_2$, or $SiH_2Cl_2$, $NH_3$ and $N_2$. Corresponding reaction gas for the active layer thin film may be a mixture gas of $SiH_4$ and $H_2$, or $SiH_2Cl_2$ and $H_2$, and corresponding reaction gas for an ohmic contact layer may be $SiH_4$, $PH_3$ and $H_2$;

A second patterning process may in detail comprise:

Step 220, coating a photoresist layer on the active layer thin film;

Step 230, exposing and developing the photoresist layer by employing a half-tone mask or a gray-tone mask to form patterns including a completely-retained region, a partially-retained region and a completely-removed region, wherein the half-tone mask or gray-tone mask has a partial-exposing region to form correspondingly the photoresist partially-retained region, and a thickness of the photoresist in the partially-retained region is smaller than that of the photoresist in the completely-retained region. The completely-removed region corresponds to the bridge via hole 7 and the source electrode via hole 8 and may further correspond to a first pad region via hole 16, and the completely-retained region corresponds to the active layer 6, and the rest region is the partially-retained region;

Step 240, performing a first etching process on the gate insulating layer thin film and the active layer thin film to etch away the gate insulating layer thin film and the active layer thin film in the completely-removed region to form at least the bridge via hole 7 and the source electrode via hole 8 and the first pad region via hole 16 may be further formed, wherein the shape of each via hole is not limited, and preferably, the bridge via hole 7 used to connect the adjacent sections of the discontinuous data line 2 may be of a relative smaller size and the shape of the cross-section thereof may be a circle, and the source electrode via hole 8 used to connect the data line 2 and the source electrode 10 may be of a relative larger size and the shape of the cross-section thereof may be a rectangle. In the embodiment, the source electrode via hole 8 is also used as a bridge via hole for connecting the adjacent sections of the data line 2 along with the bridge via hole 7.

Step 250, ashing the photoresist in the completely-retained region and the partially-retained region based on a thickness of the photoresist in the partially-retained region, so that the photoresist in the partially-retained region is completely removed, and the photoresist in the completely-retained region is partially removed;

Step 260, performing a second etching process on the active layer thin film to etch away the active layer thin film in the partially-retained region so as to form the active layer 6, and here the active layer 6 comprise a stack of a semiconductor layer 18 and a doped semiconductor layer 19.

Figure 3:
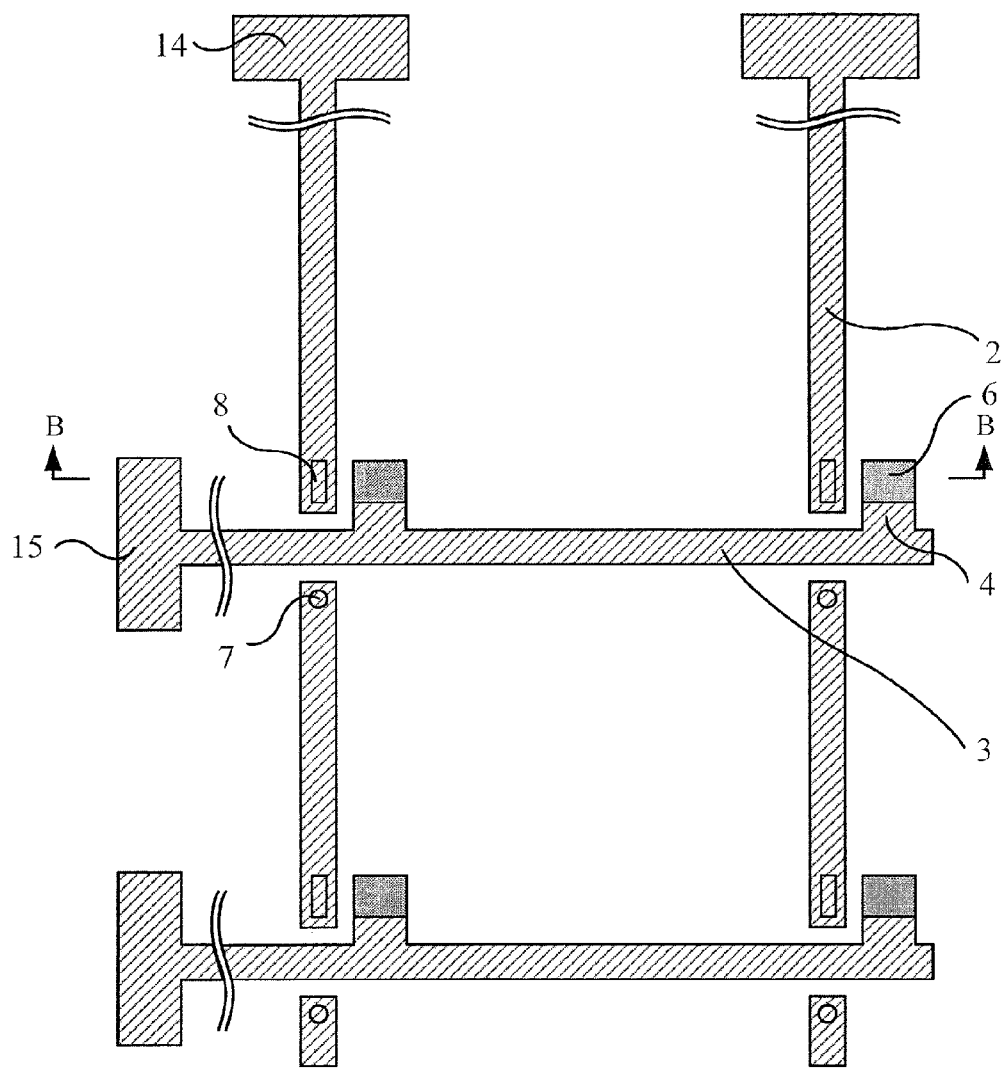
FIG. 3 is a top partial structural schematic view after a second patterning process of the array substrate manufactured in the second embodiment of the present invention.
Figure 4:
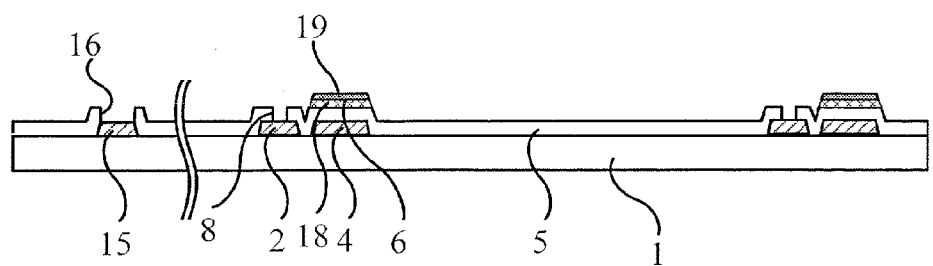
FIG. 4 is a cross-sectional side view taken along line B-B in FIG. 3.

FIG. 3 is a top partial structural schematic view after a second patterning process of the array substrate manufactured in the second embodiment, and FIG. 4 is a cross-sectional side view taken along line B-B in FIG. 3.

In the step 300, forming a pixel electrode, a source electrode, a drain electrode and a bridge line on the base substrate after the step 200 through a patterning process may comprises:

Step 310, deposited a pixel electrode thin film on the base substrate 1 after the step 200. For example, a pixel electrode thin film with a thickness of 300~600 Å is deposited on the base substrate 1 after the step 200 by a sputtering method or a thermal evaporation method, and the pixel electrode thin film may be formed of a transparent conductive material, such as indium tin oxide (ITO), indium zinc oxide (IZO), or other metal or metal oxide;

A third patterning process may in detail comprise:

Step 320, coating a photoresist layer on the pixel electrode thin film;

Step 330, exposing and developing the photoresist layer by employing a normal mask to form patterns for a completely-retained region and a completely-removed region, wherein the completely-retained region corresponds to a pixel electrode 9, a source electrode 10, a drain electrode 1 and a bridge line 12;

Step 340, performing an etching process on the pixel electrode thin film to etch away the pixel electrode thin film in the completely-removed region so as to form the pixel electrode 9, the source electrode 10, the drain electrode 11 and the bridge line 12, wherein the pixel electrode 9 is formed integrally with the drain electrode 11, and the source electrode 10 is connected with the data line 2 through the source electrode via hole 8, and the bridge line 12 connects the adjacent sections of the discontinuous data lines 2, and the source electrode 10 is formed integrally with the bridge line 12. At this time, the pixel electrode thin film directly above the data line pad region 1 and the gate line pad region 15 is remained and functions to protect a metal in the pad region.

Because in the present embodiment, the active layer 6 comprises the stack of the semiconductor layer 18 and the doped semiconductor layer 19, a TFT channel is formed after the third patterning process, and the following steps are performed.

Step 350, performing selective dry etching on the base substrate 1 after the step 340 to etch away the doped semiconductor layer thin film between the source electrode 10 and the drain electrode 11 so as to form the TFT channel. The selective dry etching process selectively etch a target material, that is, the speed to etch a semiconductor material is relatively faster, and the speed to etch the material of the gate insulating layer 5 and the pixel electrode 9 is much slower, and thus in operation the selectively dry etching may not substantially influence other film layers. Therefore, in the present step, the desirable pattern is formed directly by an etching process and without needing a mask.

Step 400, forming a protection film layer 13 with a thickness of 4000~150000 Å on the base substrate 1 after the step 300 by a spin coating method. The protection film layer 13 may be an organic insulating layer, and the surface of the protection film layer 13 may be planarized, so that the semiconductor layer 18 in the TFT channel can be protected and the surface of the array substrate can be planarized, and it is advantageous to perform the subsequent assembling process and the like.

The material of the protection film layer 13 may be a photosensitive material, and then, forming a second pad region via hole 17 on the protection film layer 13 by using a patterning process may comprise:

Step 500, exposing and developing the protection film layer 13 by employing a normal mask to form the second pad region via hole 17. In the present step, because the protection film layer 13 has photosensitivity equivalent to photoresist, after performing an exposing process, a completely-retained region of the protection film layer 13 corresponds to the pixel region and a completely-removed region of the protection film layer 13 corresponds to an edge region or the second pad region via hole 17, and after a developing process, the protection film layer 13 in the completely-removed region is removed without an etching process, and thus, the process is simplified.

Figure 5:
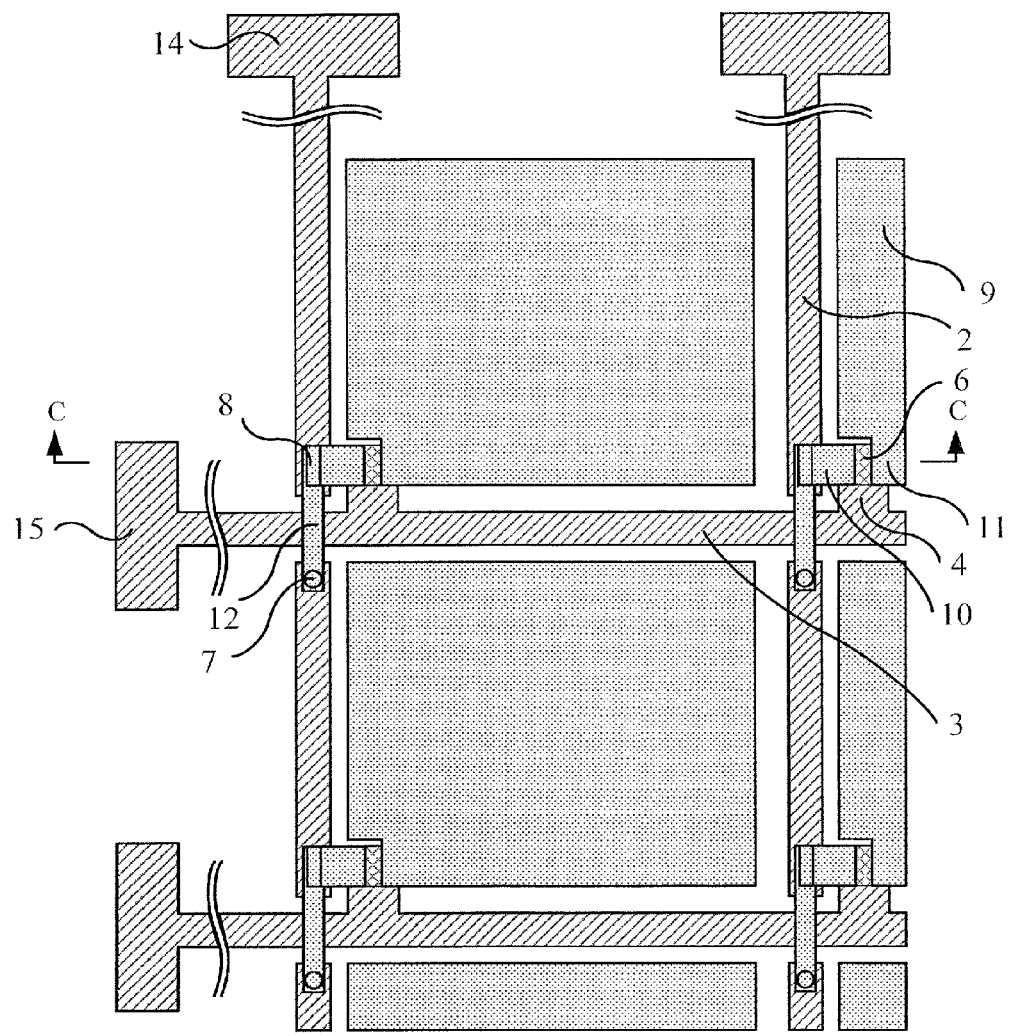
FIG. 5 is a top structural schematic view showing a part of the array substrate manufactured in the second embodiment of the present invention.
Figure 6:
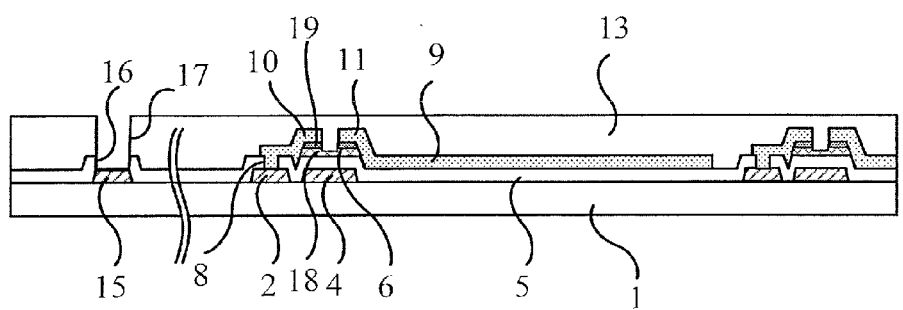
FIG. 6 is a cross-sectional side view taken along line C-C in FIG. 5.

FIG. 5 is a top structural schematic view showing a part of the array substrate manufactured in the second embodiment, and FIG. 6 is a cross-sectional side view taken along line C-C in FIG. 5.

With the present embodiment, the array substrate can be manufactured using a three-patterning process, which simplifies the manufacturing procedure and improves the productivity and lowers the manufacturing cost. The present embodiment is also adaptable to the case where the gate line is discontinuously formed and only patterns for the data line, the gate line, the bridge via hole and the bridge line need to be adjusted.

Third Embodiment

A method of manufacturing an array substrate according to the third embodiment is based on the first embodiment, and comprises the following steps.

Step 110, deposited a metal thin film with a thickness of 500~4000 Å on a base substrate 1 by a sputtering method or a thermal evaporation method;

Step 120, coating a photoresist layer on the metal thin film;

Step 130, exposing and developing the photoresist using a normal mask to form a completely-retained region and a completely-removed region;

Step 140, performing an etching process on the metal thin film to etch away the metal thin film in the completely-removed region so as to form a data line 2, a gate line 3 and a gate electrode 4, and simultaneously, a data line pad region 14 and a gate line pad region 15 may be further formed. In the present embodiment, a discontinuous gate line 3 and a continuous data line 2 are formed as an example.

Figure 7:
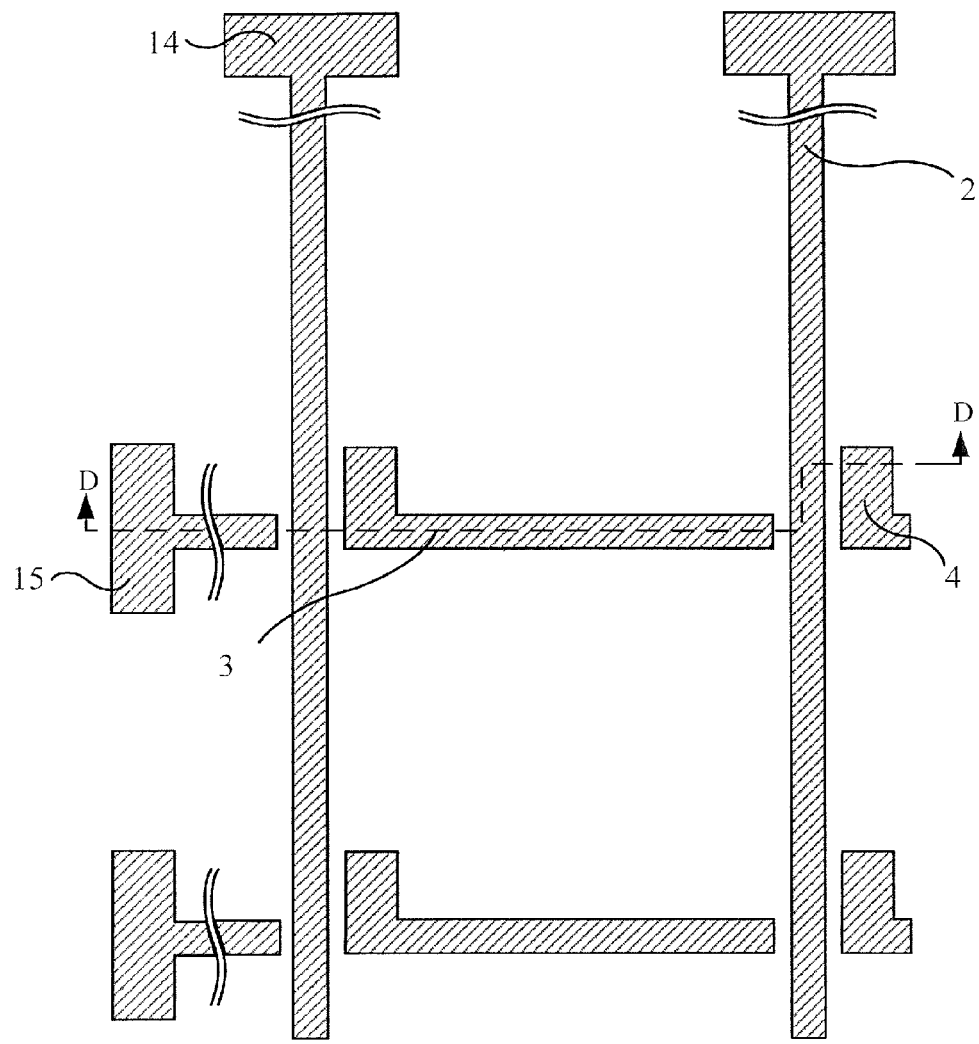
FIG. 7 is a top partial structural schematic view after a first patterning process of the array substrate manufactured in the third embodiment of the present invention.
Figure 8:
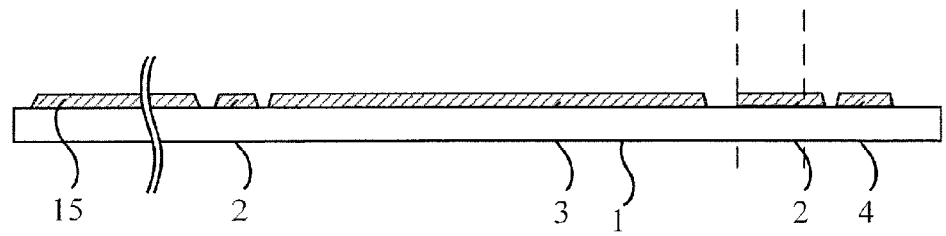
FIG. 8 is a cross-sectional side view taken along line D-D in FIG. 7.

FIG. 7 is a top partial structural schematic view after a first patterning process of the array substrate manufactured in the third embodiment, and FIG. 8 is a cross-sectional side view taken along line D-D in FIG. 7. A region in which a pixel unit is formed is a pixel region and the periphery of the pixel region is an edge region.

Step 210', sequentially depositing a gate insulating layer thin film with a thickness of 1000~4000 Å by a PECVD method and an oxide semiconductor (such as, indium gallium zinc oxide (IGZO)) layer thin film with a thickness of 500~3000 Å as an active layer thin film by a sputtering method on the base substrate 1 after the step 100;

Step 220, coating a photoresist layer on the active layer thin film;

Step 230, exposing and developing the photoresist using a half-tone mask or a gray-tone mask to form a completely-retained region, a partially-retained region a completely-removed region;

Step 240, performing a first etching process on the gate insulating layer thin film and the active layer thin film to etch away the gate insulating layer thin film and the active layer thin film in the completely-removed region so as to at least form bridge via holes 7 and a source electrode via hole 8, and further, a first pad region via hole 16 may be formed;

Step 250, ashing the photoresist in the completely-retained region and the partially-retained region based on a thickness of the photoresist in the partially-retained region, so that the photoresist in the partially-retained region is completely removed, and the photoresist in the completely-retained region is partially removed;

Step 260, performing a second etching process on the active layer thin film to etch away the active layer thin film in the partially-retained region so as to form the active layer 6.

Figure 9:
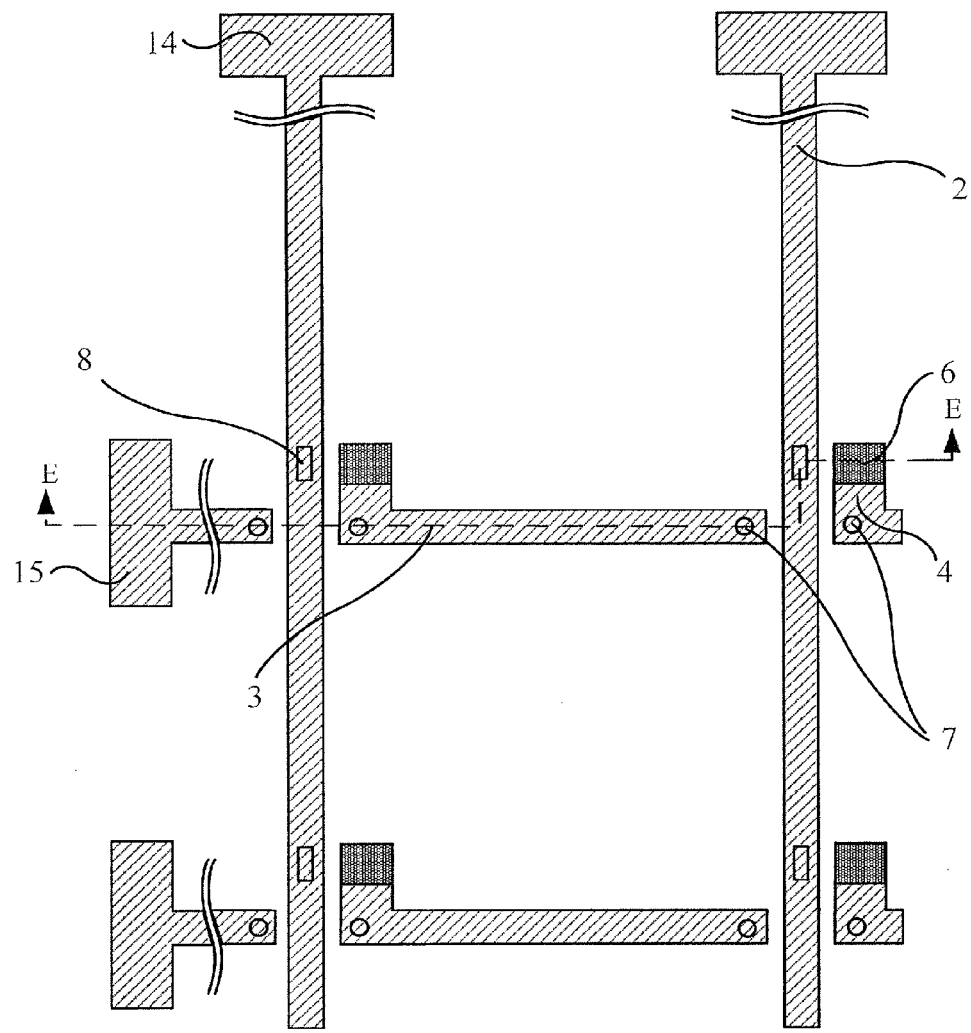
FIG. 9 is a top partial structural schematic view after a second patterning process of the array substrate manufactured in the third embodiment of the present invention.
Figure 10:
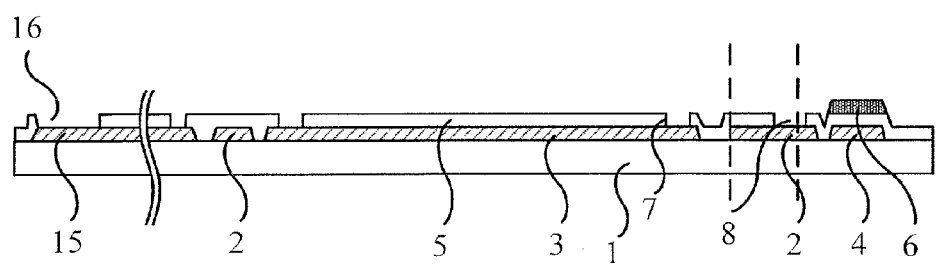
FIG. 10 is a cross-sectional side view taken along line E-E in FIG. 9

FIG. 9 is a top partial structural schematic view after a second patterning process of the array substrate manufactured in the third embodiment, and FIG. 10 is a cross-sectional side view taken along line E-E in FIG. 9.

Step 310, deposited a pixel electrode thin film with a thickness of about 300~600 Å on the base substrate 1 after the step 200 by a sputtering method or a thermal evaporation method;

Step 320, coating a photoresist layer on the pixel electrode thin film;

Step 330, exposing and developing the photoresist layer by employing a normal mask to form patterns for a completely-retained region and a completely-removed region, wherein the completely-retained region corresponds to a pixel electrode 9, a source electrode 10, a drain electrode 1 and a bridge line 12;

Step 340, performing an etching process on the pixel electrode thin film to etch away the pixel electrode thin film in the completely-removed region so as to form the pixel electrode 9, the source electrode 10, the drain electrode 11 and the bridge line 12, wherein the pixel electrode 9 is formed integrally with the drain electrode 11, and the source electrode 10 is connected with the data line 2 through the source electrode via hole 8, and the bridge line 12 connects the adjacent sections of the discontinuous gate line 3. The present embodiment is different from the first embodiment in that the bridge via holes 7 in each pixel unit are provided in pair and the bridge line 12 is parallel to the gate line 3 and connects the adjacent sections of the discontinuous gate line 3. At this time, the pixel electrode thin film directly above the data line pad region 14 and the gate line pad region 15 is remained and functions to protect a metal material in the pad region.

Because an oxide semiconductor layer is used as the active layer in the present embodiment, and the contact resistance between the oxide semiconductor and the pixel electrode material is relative small and a carrier mobility is relative higher, a electrical property between the oxide semiconductor and the source electrode and the drain electrode formed of the pixel electrode material is good and there is no special process needed to form the TFT channel.

Step 400, forming a protection film layer 13 with a thickness of 4000~15000 Å on the base substrate 1 after the step 300 by a spin coating method, so that oxide semiconductor layer can be protected and a surface of the array substrate can be planarized, and it is advantageous to perform the sequent assembling process and the like.

Step 500, exposing and developing the protection film layer 13 formed of a photosensitive material by employing a normal mask to form the second pad region via hole 17.

Figure 11:
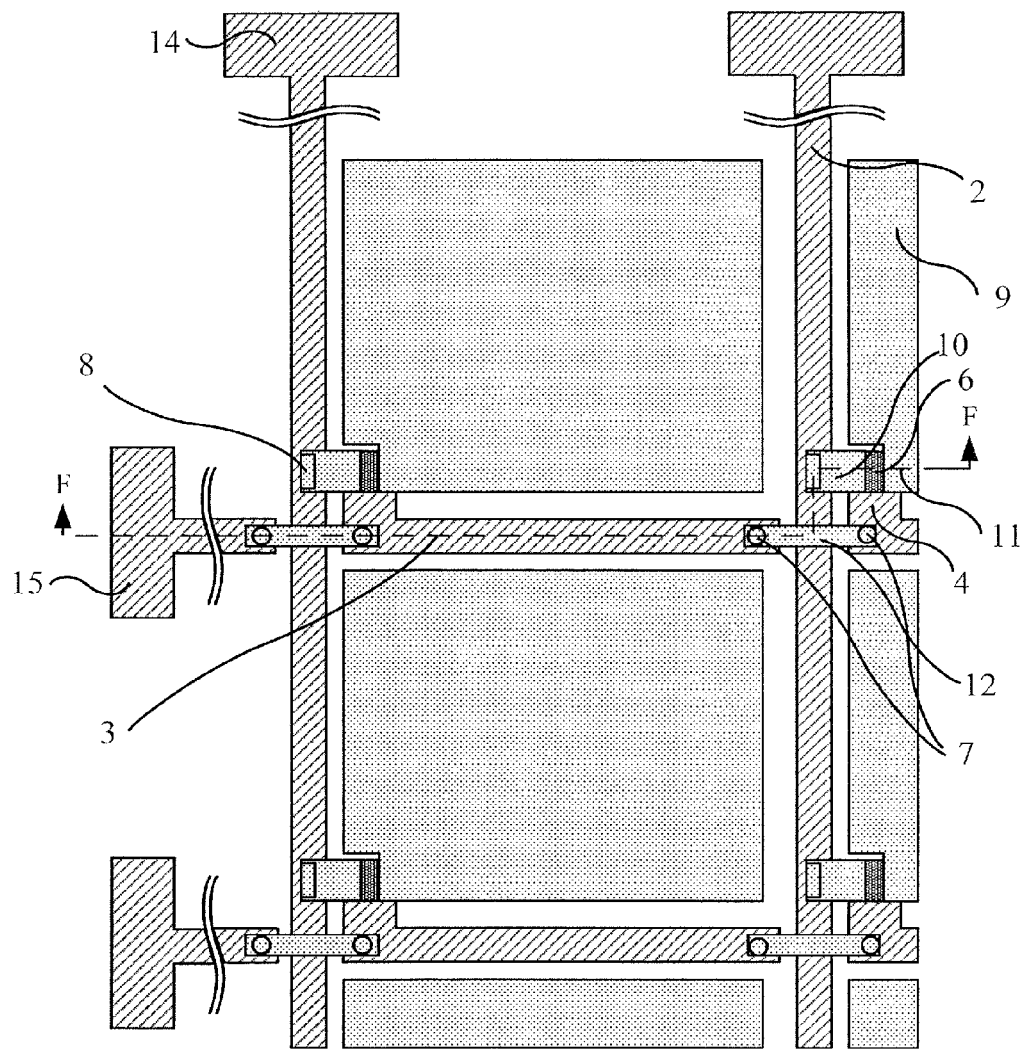
FIG. 11 is a top structural schematic view showing a part of the array substrate manufactured in the third embodiment of the present invention.
Figure 12:
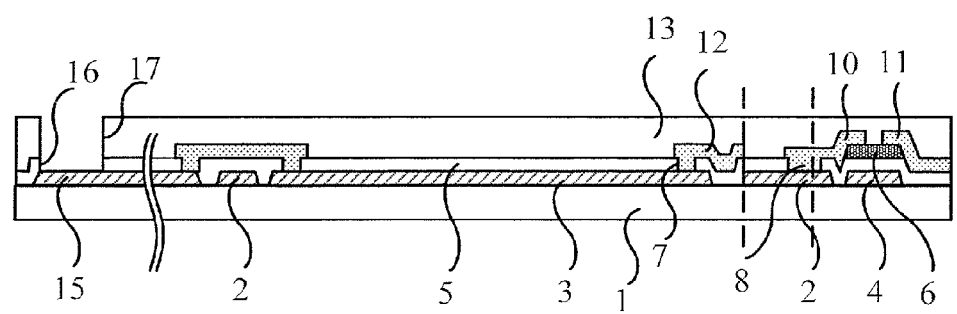
FIG. 12 is a cross-sectional side view taken along line F-F in FIG. 11.

FIG. 11 is a top structural schematic view showing a part of the array substrate manufactured in the third embodiment, and FIG. 12 is a cross-sectional side view taken along line F-F in FIG. 11.

With the present embodiment, a three-patterning process can be performed. Further, the contact resistance between the source/drain electrode and the active layer is decreased by using the oxide semiconductor layer as the active layer, and thus, an ohmic contact layer which is formed of a doped semiconductor material may be omitted, and a process of forming the TFT channel may be also omitted. The present embodiment can save the material and avoid the procedure of depositing an ohmic contact layer and forming the TFT channel, and the manufacturing cost is further decreased.

With the embodiments, the array substrate of a TFT-LCD is manufactured by a three-patterning process, in which the data line and the gate line are simultaneously formed by using one patterning process, and as compared with a conventional four-mask process, the manufacturing procedure is simplified, expenses used for the manufacturing apparatus can be decreased, productivity is improved and the manufacturing cost is reduced.

With the present embodiment, by using a transparent conductive metal having a relative small contact resistance with the oxide semiconductor layer to form the source electrode and the drain electrode, a doped semiconductor layer commonly formed in a conventional process is not used and at the same time the process for forming a TFT channel can also be omitted. Therefore, the manufacturing material is saved, the manufacturing time is shortened, and productivity is improved. Because a pixel electrode and the source/drain electrodes are formed in the same layer, a passivation layer cannot be provided, and thus, the protection film layer with flatness may displace the passivation layer to enhance the effect of the sequent assembling process.

Fourth Embodiment

Figure 13:
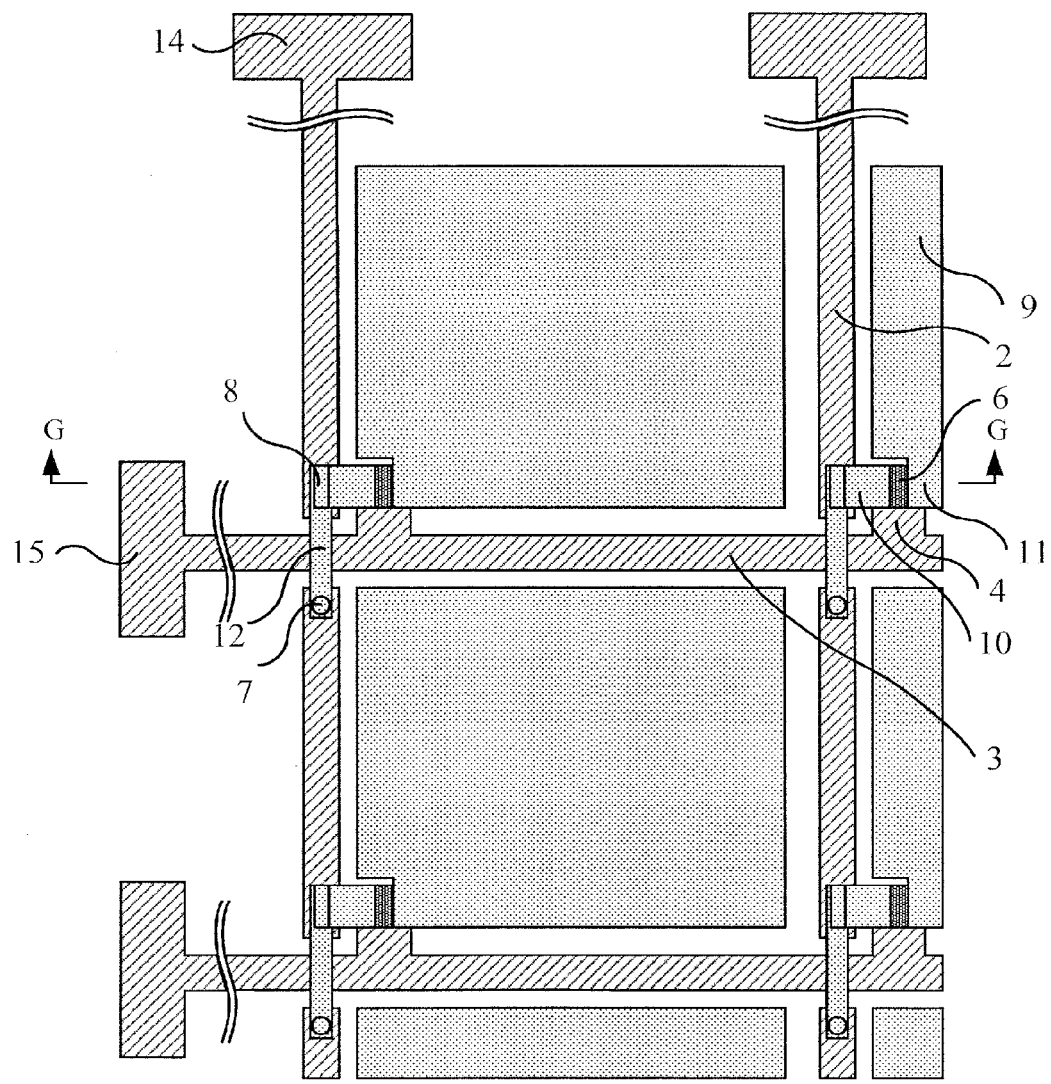
FIG. 13 is a top structural schematic view showing a part of the array substrate manufactured in the fourth embodiment of the present invention.
Figure 14:
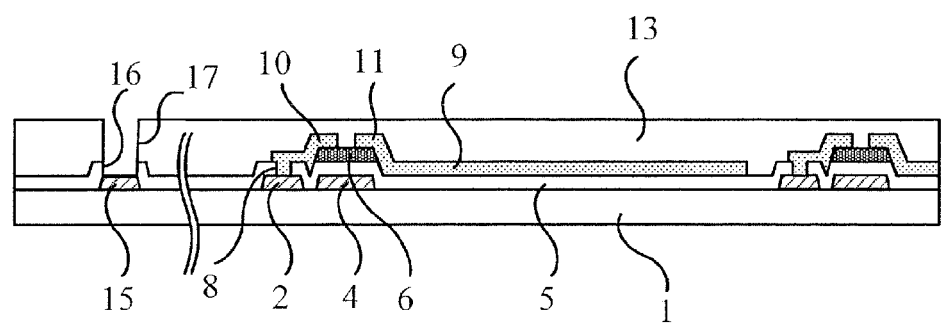
FIG. 14 is a cross-sectional side view taken along line G-G in FIG. 13.

FIG. 13 is a top structural schematic view showing a part of the array substrate manufactured in the fourth embodiment, and FIG. 14 is a cross-sectional side view taken along line G-G in FIG. 13.

In the fourth embodiment, the array substrate comprises a base substrate 1, and a data line 2 and a gate line 3 are crossed with each other on the base substrate 1 so as to define a pixel unit, and a pixel electrode 9 and a TFT are arranged in the pixel unit. The TFT comprises a gate electrode 4, an active layer 6, a source electrode 10 and a drain electrode 11, wherein the data line 2 and the gate line 3 are formed with the same material in the same layer and the data line 2 is discontinuously disposed so as to be separated from the gate line 3. A bridge via hole 7 and a source electrode via hole 8 are formed in a gate insulating layer 5 covering the data line 2, the gate line 3 and the gate electrode 4, wherein the bridge via hole 7 is located at positions respectively corresponding to adjacent sections of the discontinuous data lines 2, and the source electrode via hole 8 also corresponds to the data line 2. A source electrode 10, a drain electrode 11 and a pixel electrode 9 are formed of the same material in the same layer, and a bridge line 12 is simultaneously formed, and the drain electrode 11 and the pixel electrode 9 are formed integrally. The source electrode 10 is connected with the data line 2 through the source electrode via hole 8 and the bridge line 12 connects the adjacent sections of the discontinuous data lines 2 through the bridge via hole 7 and the source electrode via hole 8. That is, the source electrode via hole 8 also works another bridge via hole. In order to protect each pattern structure on the array substrate, a protection film layer 13 may cover the source electrode 10, the drain electrode 11, the pixel electrode 9 and the bridge line 12. It is obvious that the bridge via holes can be formed in pair, in which case the source electrode via hole 8 is used only to connect source electrode 10 and the data line 2.

A pad region pattern may be formed in an edge region of the above array substrate, that is: a data line pad region 14 and a gate line pad region 15 may be included and disposed the edge region of the array substrate, and formed in the same layer with the data line 2, the gate electrode 4 and the gate line 3 by using the same material; a first pad region via hole 16 may be further included and formed in gate insulating layer 5 to expose the data line pad region 14 and the gate line pad region 15; a second pad region via hole 17 is further included and formed in the protection film layer 13 to exposure the data line pad region 14 and the gate line pad region 15. The first pad region via hole 16 and the second pa region via hole 17 may be overlapped with each other.

With the method, the array substrate of the present embodiment may be manufactured by using a three-patterning process, which simplifies the manufacturing procedure and lowers the cost.

In the present embodiment, the active layer is preferably formed of an oxide semiconductor, such as IGZO, which causes the contact resistance between the oxide semiconductor layer and a source/drain electrode formed of the pixel electrode material being relative smaller, and an ohmic layer is not necessary and a TFT channel need not to be formed, and thus, the manufacturing material is further saved and the manufacturing cost is further decreased.

Fifth Embodiment

Figure 15:
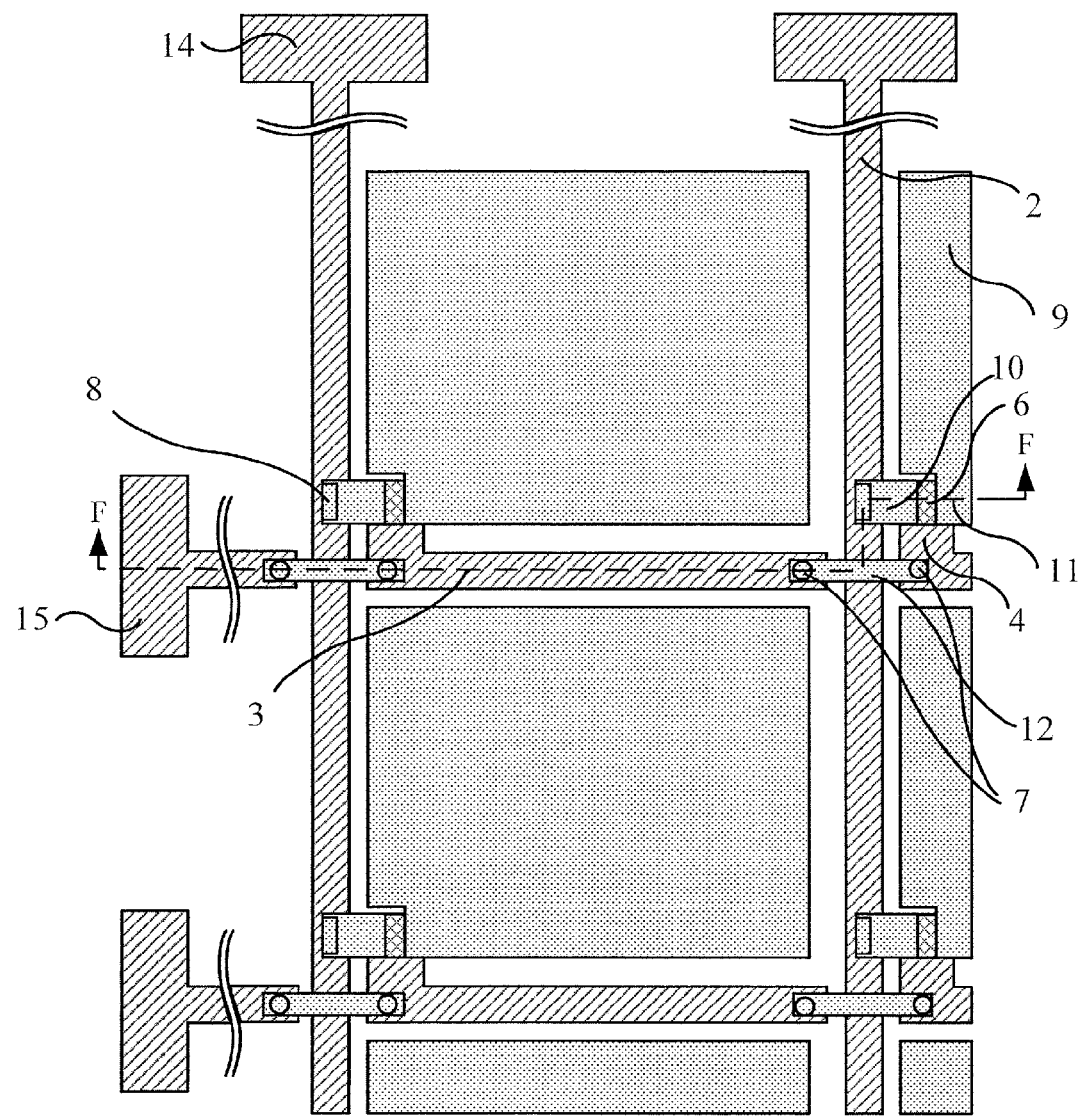
FIG. 15 is a top structural schematic view showing a part of the array substrate manufactured in the fifth embodiment of the present invention.
Figure 16:
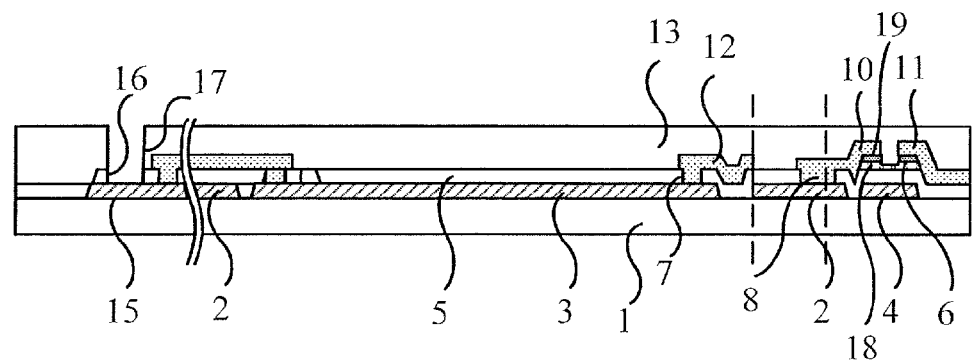
FIG. 16 is a cross-sectional side view taken along line H-H in FIG. 15.

FIG. 15 is a top structural schematic view showing a part of the array substrate manufactured in the fifth embodiment, and FIG. 16 is a cross-sectional side view taken along line H-H in FIG. 15.

The difference between the present embodiment and the fourth embodiment lies in that: a data line 2 is continuous, and a gate line 3 is discontinuously disposed so as to be separated from the data line 2, and bridge via holes 7 in pair are located at positions respectively corresponding to the adjacent sections of the discontinuous gate line 3 and a bridge line 12 connects the adjacent sections of the discontinuous gate line 3 through the bridge via holes 7 in pair.

In this present embodiment, the active layer 6 may comprise a semiconductor layer 18 and a doped semiconductor layer 19, and the doped semiconductor layer 19 between the source electrode 10 and the drain electrode 11 is etched away to form a TFT channel. With the method, the array substrate of the present embodiment may be manufactured by using a three-patterning process, which simplifies the manufacturing procedure and lowers the cost.

The material, the shape and the manufacturing process for each film layer may be adjusted as necessary. For example, a thickness of the active layer thin film is 500~4500 Å; the material of the active layer is an oxide semiconductor, and the oxide semiconductor may be IGZO; a thickness of the data line, the gate electrode and the gate line is 500~4000 Å, a material thereof may be any one or more of Cr, W, Ti, Ta, Mo, Al or Au; the thickness of the gate insulating layer is 1000~4000 Å, a material thereof is oxide, nitride or oxynitride; the thickness of the pixel electrode is 300~600 Å, and a material thereof may be ITO or IZO; the shape of the cross section of the bridge via hole is a circle, and the shape of the cross section of the source electrode via hole is a rectangle; the thickness of the protection film layer is 4000~15000 Å and a material thereof may be an organic insulating material, and the surface of the protection film layer is positioned in the same level and is planarized. The material of the protection film layer is preferably a photosensitive organic insulating material, and thus, when forming the second pad region via hole, the etching process may be omitted and only by the exposing and developing processes employing a mask, the second pad region via hole is formed.

The above description only describes detailed embodiments of the present invention, and it is not a limitation of the protection scope of the present invention. Accordingly, it should be understood that many modifications or alternation which can be made easily by those of ordinary skill in the art within the disclosure of the present invention, will fall within the scope of the present invention as defined by the appended claims.

What is claimed is:

1. An array substrate, comprising:
    a base substrate,
    a data line and a gate line crossed with each other on the base substrate so as to define a pixel unit, and
    a pixel electrode and a thin film transistor (TFT) arranged in the pixel unit,
    wherein the TFT comprises a gate electrode, an active layer, a source electrode and a drain electrode, the data line and the gate line are formed in the same layer, and the data line is discontinuously disposed so as to be separated from the gate line or the gate line is discontinuously disposed so as to be separated from the data line;
    bridge via holes and a source electrode via hole are formed in a gate insulating layer covering the data line, the gate line and the gate electrode, and the bridge via holes are located at positions respectively corresponding to adjacent discontinuous sections of the data line or adjacent discontinuous sections of the gate line, and the source electrode via hole corresponds to the data line; and
    the source electrode, the drain electrode, the pixel electrode and the bridge line are formed in the same layer, and the drain electrode and the pixel electrode are formed integrally, and the source electrode is connected with the data line through the source electrode via hole and the bridge line connects the adjacent discontinuous sections of the data line or the adjacent discontinuous sections of the gate line through the bridge via holes.

2. The array substrate as claimed in claim 1, wherein when the data line is discontinuously disposed, one of the bridge via holes and the source electrode via hole are combined into one via hole.

3. The array substrate as claimed in claim 1, further comprising:
    a protection film layer, covering the source electrode, the drain electrode, the pixel electrode and the bridge line.

4. The array substrate as claimed in claim 1, wherein the active layer comprises a semiconductor layer and a doped semiconductor layer, and the doped semiconductor layer positioned between the source electrode and the drain electrode is etched away to form a TFT channel.

5. The array substrate as claimed in claim 4, wherein a thickness of the active layer thin film is 500~4500 Å.

6. The array substrate as claimed in claim 1, wherein a material of the active layer is an oxide semiconductor.

7. The array substrate as claimed in claim 1, wherein the thickness of the data line, the gate electrode and the gate line is 500~4000 Å, and a material thereof is selected from a group consisting of Cr, W, Ti, Ta, Mo, Al and any combination thereof.

8. The array substrate as claimed in claim 1, wherein a thickness of the gate insulating layer is 1000~4000 Å, and a material thereof is selected from a group consisting of oxide, nitride and oxynitride.

9. The array substrate as claimed in claim 1, wherein a thickness of the pixel electrode is 300~600 Å and a material thereof is selected from a group consisting of indium tin oxide and indium zinc oxide.

10. The array substrate as claimed in claim 1, wherein a shape of the cross section of the bridge via hole is a circle, and a shape of the cross section of the source electrode via hole is a rectangle.

11. The array substrate as claimed in claim 1, wherein a thickness of the protection film layer is 4000~15000 Å and a material thereof comprises an organic insulating material.

12. The array substrate as claimed in claim 1, wherein a material of the protection film layer comprises a photosensitive organic insulating material.

* * * * *